United States Patent [19]
Iwai et al.

[11] Patent Number: 5,436,484
[45] Date of Patent: Jul. 25, 1995

[54] SEMICONDUCTOR INTEGRATED CIRCUIT DEVICE HAVING INPUT PROTECTIVE ELEMENTS AND INTERNAL CIRCUITS

[75] Inventors: Hidetoshi Iwai, Ohme; Kazumichi Mitsusada, Kodaira; Masamichi Ishihara, Hinode; Tetsuro Matsumoto, Higashiyamato; Kazuyuki Miyazawa, Iruma; Hisao Katto, Hinode; Kousuke Okuyama, Kawagoe, all of Japan

[73] Assignee: Hitachi, Ltd., Tokyo, Japan

[21] Appl. No.: 143,151

[22] Filed: Oct. 29, 1993

Related U.S. Application Data

[60] Continuation of Ser. No. 815,863, Jan. 2, 1992, Pat. No. 5,276,346, which is a continuation of Ser. No. 404,618, Sep. 8, 1989, abandoned, which is a continuation-in-part of Ser. No. 106,341, Oct. 9, 1987, abandoned, which is a division of Ser. No. 825,587, Feb. 3, 1986, Pat. No. 4,717,684, and a continuation-in-part of Ser. No. 390,424, Aug. 4, 1989, abandoned, which is a continuation of Ser. No. 198,597, May 23, 1988, abandoned, which is a continuation of Ser. No. 937,452, Dec. 1, 1986, abandoned, which is a continuation of Ser. No. 686,598, Dec. 26, 1984, abandoned.

[30] Foreign Application Priority Data

Dec. 26, 1983 [JP] Japan ............................ 58-243801
Feb. 1, 1985 [JP] Japan ............................ 60-16508

[51] Int. Cl.⁶ .................... H01L 29/06; H01L 29/78
[52] U.S. Cl. .................................. 257/360; 257/357; 257/368; 257/402; 257/408
[58] Field of Search .............. 257/203, 355, 356, 357, 257/360, 368, 402, 408

[56] References Cited

U.S. PATENT DOCUMENTS 3,731,161 4/1973 Yamamoko .

(List continued on next page.)

FOREIGN PATENT DOCUMENTS

| 0054117 | 4/1981 | European Pat. Off. . |
| 0043284 | 2/1982 | European Pat. Off. . |
| 50-39077 | 4/1975 | Japan . |
| 39077 | 7/1975 | Japan . |
| 66178 | 2/1978 | Japan . |
| 53-66178 | 6/1978 | Japan . |
| 56-50527 | 11/1981 | Japan . |
| 57-188364 | 11/1982 | Japan . |

(List continued on next page.)

OTHER PUBLICATIONS

"Hybrid Protective Device for MOS-LSI Chips", IEEE Transactions on Parts, Hybrids, and Packaging, vol. PHP-12, No. 3, (Sep. 1976).

(List continued on next page.)

*Primary Examiner*—J. Carroll
*Attorney, Agent, or Firm*—Antonelli, Terry, Stout & Kraus

[57] ABSTRACT

Disclosed is a semiconductor device having an internal circuit protected by an electrostatic protective circuit, the internal circuit and electrostatic protective circuit being formed on the same semiconductor substrate. The internal circuit includes MIS elements and has a double-diffused drain structure, while the protective circuit has a single-diffused drain structure. The internal circuit can be, e.g., a DRAM, and the protective circuit can have diffused resistors and clamping MIS elements. The single-diffused drain structure can be formed in the protective circuit on the semiconductor substrate, while providing double-diffused drain structure in the internal circuit on the same substrate, by: (1) scanning the ion implanting apparatus to avoid ion implantation of the first ions into the region of the protective circuit, and/or (2) forming a photoresist film over the region of the protective circuit to prevent ion implanation of the first ions into the protective circuit region. As a further embodiment of the present invention, a semiconductor integrated circuit device is provided wherein the source and drain regions of an MOSFET in the internal circuit have lightly doped drain (LDD) structure in order to suppress the appearance of hot carriers, and the source and drain regions of an MOSFET in the input/output circuit have structure doped with phosphorus at a high impurity concentration, in order to enhance an electrostatic breakdown voltage.

24 Claims, 12 Drawing Sheets

U.S. PATENT DOCUMENTS

| | | | |
|---|---|---|---|
| 3,754,171 | 6/1973 | Anzai et al. . | |
| 3,812,478 | 7/1974 | Tomisawa et al. . | |
| 3,999,212 | 4/1976 | Usuda . | |
| 4,108,686 | 8/1978 | Jacobus, Jr. | 257/408 |
| 4,131,908 | 12/1978 | Daub et al. . | |
| 4,172,260 | 2/1979 | Okabe et al. . | |
| 4,291,321 | 9/1981 | Pfleiderer et al. . | |
| 4,291,322 | 9/1981 | Clemens et al. . | |
| 4,295,176 | 10/1981 | Wittwer | 257/355 |
| 4,298,401 | 11/1981 | Nuez et al. . | |
| 4,325,180 | 4/1982 | Curran . | |
| 4,329,706 | 5/1982 | Crowder et al. | 257/758 |
| 4,356,623 | 11/1982 | Hunter . | |
| 4,384,301 | 4/1983 | Tasch, Jr. et al. . | |
| 4,385,337 | 5/1983 | Asamo et al. | 257/960 |
| 4,399,451 | 8/1983 | Shirai . | |
| 4,400,711 | 8/1983 | Avery . | |
| 4,419,809 | 12/1983 | Riseman et al. . | |
| 4,433,468 | 2/1984 | Kawamata . | |
| 4,445,270 | 5/1984 | Hsu . | |
| 4,466,177 | 5/1984 | Chao . | |
| 4,475,280 | 7/1984 | Ragonese et al. . | |
| 4,481,521 | 11/1984 | Okumura . | |
| 4,502,205 | 7/1985 | Yohamo . | |
| 4,509,067 | 4/1985 | Minami et al. . | |
| 4,532,697 | 11/1985 | Ko . | |
| 4,543,597 | 9/1985 | Shibata . | |
| 4,554,729 | 11/1985 | Tanimura et al. . | |
| 4,575,920 | 3/1986 | Tsunashima . | |
| 4,577,391 | 3/1986 | Hsia et al. . | |
| 4,590,663 | 5/1986 | Haken . | |
| 4,591,894 | 5/1986 | Kawakami . | |
| 4,597,827 | 7/1986 | Nishitani et al. . | |
| 4,602,267 | 7/1986 | Shirato . | |
| 4,609,931 | 9/1986 | Koike | 257/360 |
| 4,628,341 | 12/1986 | Thomas . | |
| 4,631,571 | 12/1986 | Tsubokura . | |
| 4,637,124 | 1/1987 | Okuyama et al. . | |
| 4,656,492 | 4/1987 | Sumami et al. . | |
| 4,663,645 | 5/1987 | Kumor . | |
| 4,667,009 | 5/1987 | Rugg . | |
| 4,730,208 | 3/1988 | Sugino et al. . | |
| 4,745,086 | 4/1988 | Parrillo et al. . | |
| 4,893,168 | 1/1990 | Takahashi et al. | 257/203 |
| 5,017,985 | 5/1991 | Lin . | |

FOREIGN PATENT DOCUMENTS

| | | |
|---|---|---|
| 57-130468 | 12/1982 | Japan . |
| 59-72759 | 5/1984 | Japan . |
| 59-137174 | 5/1984 | Japan . |
| 61-18171 | 1/1986 | Japan . |

OTHER PUBLICATIONS

E. Takada et al., "An As-P(n+-n-) Double Diffused Dram MOSFET for VLSI's", *IEEE Transactions on Electron Devices*, vol. ED-30 (Jun. 1983) pp. 652-657.

P. J. Tsang et al., "Fabrication of High-Performance LDDFET's with Oxide Sidewall-Spacer Technology", *IEEE Journal of Solid-State Circuits*, vol. SC-17 (Apr. 1982) pp. 220-226.

S. N. Shabde et al., "Snapback Induced Gate Dielectric Breakdown in Graded Junction MOS Structures", in IEEE/IRPS (1984) pp. 165-168.

"Analysis and Design of Digital Integrated Circuits", Hodges, et al, 1983, McGraw Hill Inc., pp. 59-60.

"An Optimized 0.5 Micron LDD Transistor" by Ralhmam, IE DM, 1983, pp. 237-239.

"Design and Characterization of the Lightly Doped Dram-Source (LDD) Insulated Gate Field-Effect Transistor", by Oguna, IEEE Transactions on Electron Devices, ED 27, (Aug. 1980), pp. 1359-1367.

"An As-P (N+-N-) Double Diffused Drain MOSFET for VLSI's", by Takeda, et al, Digest of Technical Papers Symposium on VLSI Technology, Japan (Sep. 1982), pp. 40-41.

SEMICONDUCTOR INTEGRATED CIRCUIT DEVICE HAVING INPUT PROTECTIVE ELEMENTS AND INTERNAL CIRCUITS

This is a Continuing application of application Ser. No. 07/815,863, filed Jan. 2, 1992, now U.S. Pat. No. 5,276,346, which is a Continuation application of application Ser. No. 07/404,618, filed Sep. 8, 1989, abandoned, which is (1) a Continuation-in-Part of application Ser. No. 07/106,341, filed Oct. 9, 1987, abandoned, which is a Divisional application of application Ser. No. 06/825,587, filed Feb. 3, 1986, now U.S. Pat. No. 4,717,684, issued Jan. 5, 1988; and (2) a Continuation-in-Part application of application Ser. No. 07/390,424, filed Aug. 4, 1989, abandoned, which is a Continuation application of application Ser. No. 07/198,597, filed May 23, 1988, abandoned, which is a Continuation application of application Ser. No. 06/937,452, filed Dec. 1, 1986, abandoned, which is a Continuation application of application Ser. No. 06/686,598, filed Dec. 26, 1984, abandoned.

BACKGROUND OF THE INVENTION

This invention relates to a semiconductor integrated circuit device and method of fabrication thereof, such as a semiconductor device provided with an electrostatic protective circuit and an internal circuit that are formed on the same semiconductor substrate, with, e.g., a MIS (Metal-Insulator-Semiconductor) element used as the internal circuit. More particularly, the present invention relates to a semiconductor integrated circuit device in which a measure against hot carriers and a measure against electrostatic breakdown are taken, and whose internal circuit has a MOS field effect transistor having two diffusions to form the drain region (e.g., double-diffused structure or LDD (Lightly Doped Drain) structure), as well as a method of manufacturing the same.

Miniaturization of semiconductor devices (ICs) has been attempted to increase their operating speed and improve their integration density. MOS elements (MOSFETs), which are typical examples of MIS elements (MISFETs), are no exception. To miniaturize MOS elements, the thickness of their gate oxide films has been reduced and the length of their channels has become shorter and shorter. This means that a relatively strong electric field is generated within the device, so that the injection of hot carriers into the gate oxide film occurs, and the threshold voltage shifts or a degradation of mutual conductance occurs.

A double-diffused drain structure such as that shown in FIG. 1 has been proposed to solve these problems. FIG. 1 is a section through a typical N-channel MOSFET. Reference numeral 1 denotes a P-type silicon semiconductor substrate, 2 a silicon dioxide ($SiO_2$) film, 3 a gate oxide film, and 4 a gate electrode. In order to reduce the strong electric field in the proximity of the drain, both drain and source have a double-diffused drain structure consisting of an $N^-$-type layer 5 of phosphorus (P) and an $N^+$-type layer 6 of arsenic (As) (refer to E. Takeda, et al., "An As-P (N+-N) Double Diffused Drain MOSFET for VLSI's" Digest of Technical Papers, Symp on VLSI Technology, OISO, Japan, pp. 40–41 (September 1982), the contents of which is incorporated herein by reference).

In a semiconductor device, especially a microminiaturized semiconductor device, comprising metal-oxide-semiconductor field effect transistors (MOSFETs), it is proposed to employ the LDD structure for a source and a drain to the end of preventing the appearance of hot carriers. With the LDD structure, source and drain regions are each constructed of a high impurity concentration region formed away from a gate electrode (hereinbelow, expressed as 'formed in offset to a gate electrode'), and of a low impurity concentration region disposed between the high impurity concentration region and the gate electrode. Owing to the LDD structure, the electric field of a drain edge in the direction of a channel is relaxed, with the result that the appearance of hot carriers is suppressed. Thus, the degradations of element characteristics attributed to the hot carriers can be restrained, to enhance reliability. In case of, for example, an N-channel MOSFET (hereinbelow, termed 'NMOSFET'), the low impurity concentration region mentioned above is set at a concentration on the order of, e.g., $10^{13}$ cm$^{-2}$ and, e.g., at a length of 0.2–0.4 μm.

The LDD is described in P. J. Tsang et al, *IEEE Transactions on Electron Devices*, Vol. ED-29, No. 4 (1982), p. 590.

A protective circuit is usually formed on the same semiconductor substrate to protect the MIS element forming the circuit from abnormal signals from outside the IC. As shown in FIG. 12, the protective circuit (e.g., electrostatic protective circuit) is a circuit to prevent the destruction of the gate insulating film of a MISFET 71 of a first stage inverter 68, the gate electrode of which is connected with a bonding pad 8 through a resistor 10. The destruction occurs when electrostatic energy is applied to the bonding pad.

A circuit such as that represented by the equivalent circuit diagram of FIG. 2 has been known as a typical protective circuit 9 used for protecting circuits other than the protective circuit, that is, the internal circuit of the IC. A signal to the internal circuit is applied to a bonding pad 8 through a diffusion resistor 10 of which one end is connected to the pad 8, and a clamping MOSFET 11 whose gate and source are grounded is connected to the junction between the resistor 10 and the internal circuit.

SUMMARY OF THE INVENTION

The inventors of the present invention have produced sample semiconductor devices of a double-diffused drain structure and an LDD drain structure, and have discovered the following problem.

In the semiconductor device, having a double-diffused drain structure, the protective circuit 9 also have a double-diffused drain structure. A section through the circuit 9 is shown in FIG. 3. In this drawing, reference numeral 12 denotes a P-type silicon semiconductor substrate, 13 an isolation $SiO_2$ film, 10 a resistor, 11 a clamping MOSFET (e.g., a MOSFET diode), 14 a source region, 15 a gate oxide film, 16 a gate electrode, 17 a phosphosilicate glass (PSG) film, and 18 an aluminum electrode. Both the diffused resistor 10 and the semiconductor regions of the source and drain regions of the clamping MOSFET 11 have a double-diffused drain structure, and consist of an $N^+$-type layer and an $N^-$type layer.

In the semiconductor device of this kind, however, the destruction of an insulating film of a MISFET composing a first state inverter and having a double-diffused drain tends to occur. That is, since the backward breakdown voltage at the junction of a MISFET (Diode) and having a double-diffused drain rises, the electrostatic energy is applied to the insulating film before it can leak to a substrate by breakdown of the clamping MISFET.

Similarly, using the LDD structure, the inventors manufactured D-RAMs (Dynamic-RAMs), etc., by way of trial. Based on such trials, it has been found that electrostatic breakdown voltages in input/output circuits are a problem. That is, in a case where an element of the LDD structure is utilized as an element in circuitry, such as an input or output circuit, to which external electrostatic energy is directed applied, particularly as an input protective element, the breakdown or destruction of a gate insulator film is induced even by a comparatively low electrostatic energy. A cause therefor is that, since a voltage with which the input protective element turns 'on' is raised by the presence of the low impurity concentration region, a voltage to act on the gate insulator film becomes higher, resulting in a lower electrostatic breakdown voltage.

The inventors performed repeated studies, and have also found out the following.

As regards the prevention of hot carriers, it is more effective to make the low impurity concentration regions of the source and drain regions of a MOSFET for the input or output circuit out of phosphorus, than to make them out of only arsenic. Furthermore, in a case where the source and drain regions of the MOSFET of the input or output circuit are formed by utilizing phosphorus used for the low impurity concentration region of the LDD structure, the impurity concentration is not satisfactory. That is, the voltage with which the protective element turns 'on' becomes high. Besides, in a case where phosphorus at a high concentration is introduced into a substrate by an ordinary method (a method employing a gate electrode as a mask) in order to form the source and drain regions, an effective channel length under a gate (gate effective length) becomes small because the diffusion rate of phosphorus is great. When it is intended to cope with this drawback, the length of the gate increases, contrariwise to the microminiaturization of the semiconductor device. Of course, hot carriers appear with the construction which uses only arsenic for the formation of the source and drain regions.

Accordingly, an object of the present invention is to enhance the breakdown or destruction voltage of a MOS type semiconductor integrated circuit device.

Another object of the present invention is to provide a semiconductor device wherein an internal circuit is protected by an electrostatic protective circuit, and methods of forming such semiconductor device.

Another object of the present invention is to provide a semiconductor device which can enhance an electrostatic breakdown or destruction (ESD) voltage in a semiconductor device employing a MOSFET of the double-diffused or LDD structure in its internal circuit and, particularly, including a MOSFET as an element in circuitry such as an input or output circuit to which external electrostatic energy is to be directly applied, and a method of fabricating such device.

Another object of the present invention is to provide a semiconductor device which renders the appearance of hot carriers difficult while enhancing an electrostatic breakdown voltage.

A further object of the present invention is to provide a semiconductor device which can achieve a rise in the operating speed of an element without increasing the resistances of source and drain regions.

Still another object of the present invention is to provide a method of manufacturing a semiconductor device which can produce the aforementioned semiconductor device readily without drastically altering a manufacturing process of a semiconductor device.

These and other objects and novel features of this invention will become more apparent from the following description, taken in conjunction with the accompanying drawings.

Of the inventions disclosed herein, the following illustrates a typical example. However, the present invention is not limited thereto.

The internal circuit consists of a double-diffused drain structure in order to reduce the degradation of characteristics resulting from the hot carriers, while the protective circuit includes a single-diffused drain structure, so that the field intensity acting upon the gate oxide film of, e.g., the clamping MOSFET can be reduced, and a semiconductor device with a high destruction voltage can be obtained.

Typical aspects of performance of the present invention will be briefly summarized below.

The input or output circuit of a semiconductor device employing a MOSFET of the LDD structure in its internal circuit is constructed of a MOSFET of a structure in which source and drain regions are doped with phosphorus at a high concentration. Thus, enhancement in an electrostatic destruction voltage is achieved, while the appearance of hot carriers is rendered difficult.

Further, phosphorus at a high concentration is introduced in such a way that side wall spacers formed on both the sides of a gate electrode are used as a mask during such introduction. Thus, notwithstanding that the diffusion rate of phosphorus is great, source and drain regions which overlap the gate electrode at most only a little can be formed. As the step of forming the side wall spacers, the step of forming side wall spacers for the LDD structure of the internal circuit can be utilized as it is, so that a sharp increase in the number of steps is not involved.

DETAILED DESCRIPTION OF THE INVENTION

Hereinafter, one embodiment of the semiconductor device and the method of fabricating it in accordance with the present invention will be described with reference to FIGS. 4 through 10. However, such description is not limiting of the invention in its various aspects.

Figure 4:
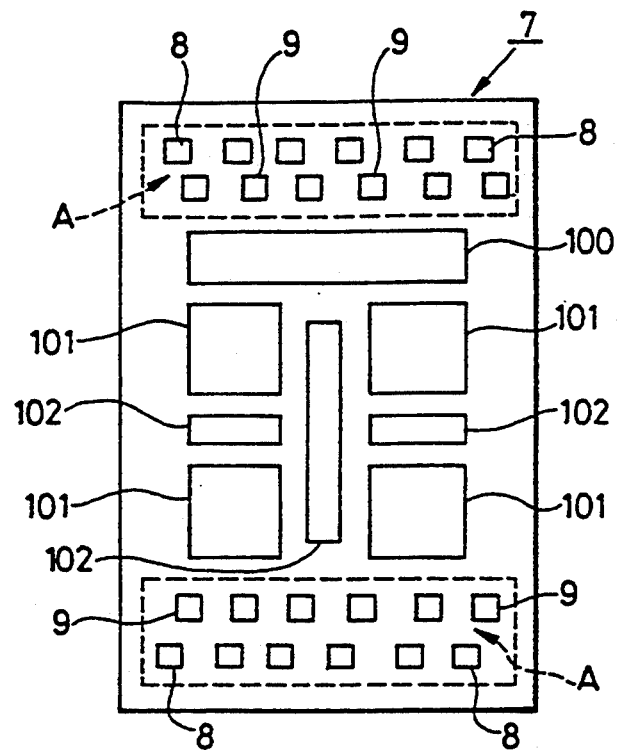
FIG. 4 is a plan view of an example of the chip pattern of a DRAM provided with an electrostatic protective circuit and an internal circuit on the same semiconductor substrate.

FIG. 4 shows an example of the layout of a chip 7 of a DRAM in accordance with one embodiment of the invention. Reference numeral 8 denotes a bonding pad, 9 denotes a protective circuit provided for each bonding pad, 100 denotes a signal generation circuit which generates read and write timing signals, etc., 101 denotes a memory array in which MIS elements are used as memory cells, and 102 denotes column and row decoders. These members constitute the DRAM (dynamic random-access memory) chip.

Figure 6:
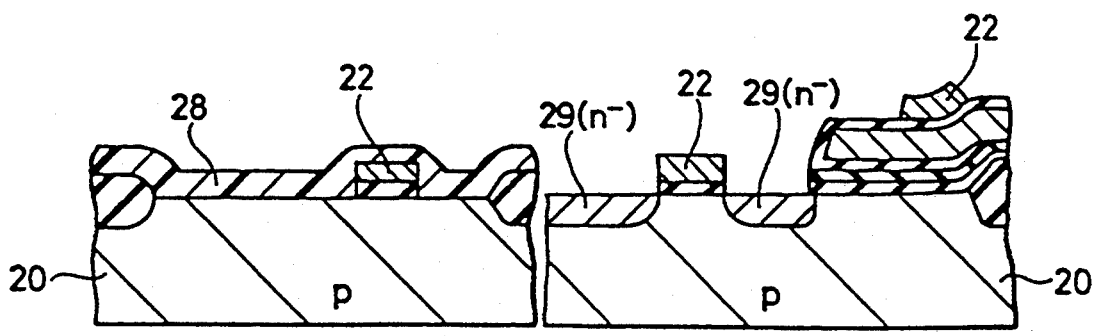
Figure 7:
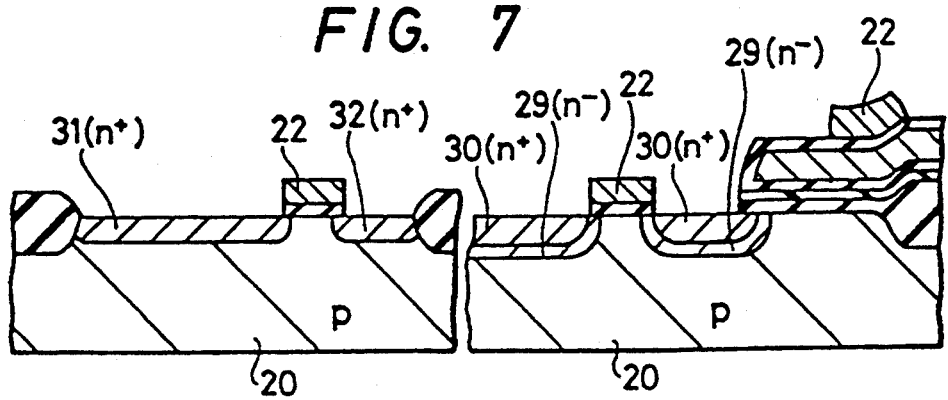
Figure 8:
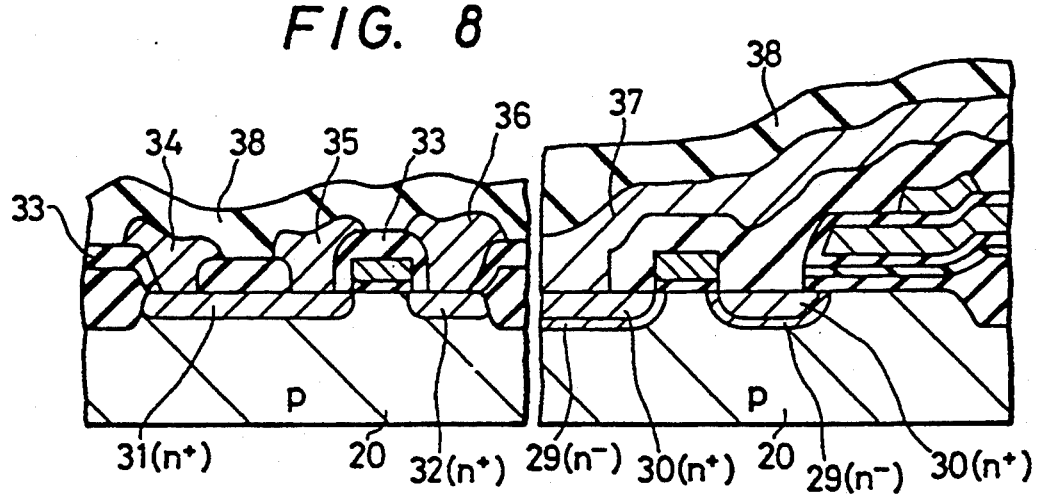
Figure 9:
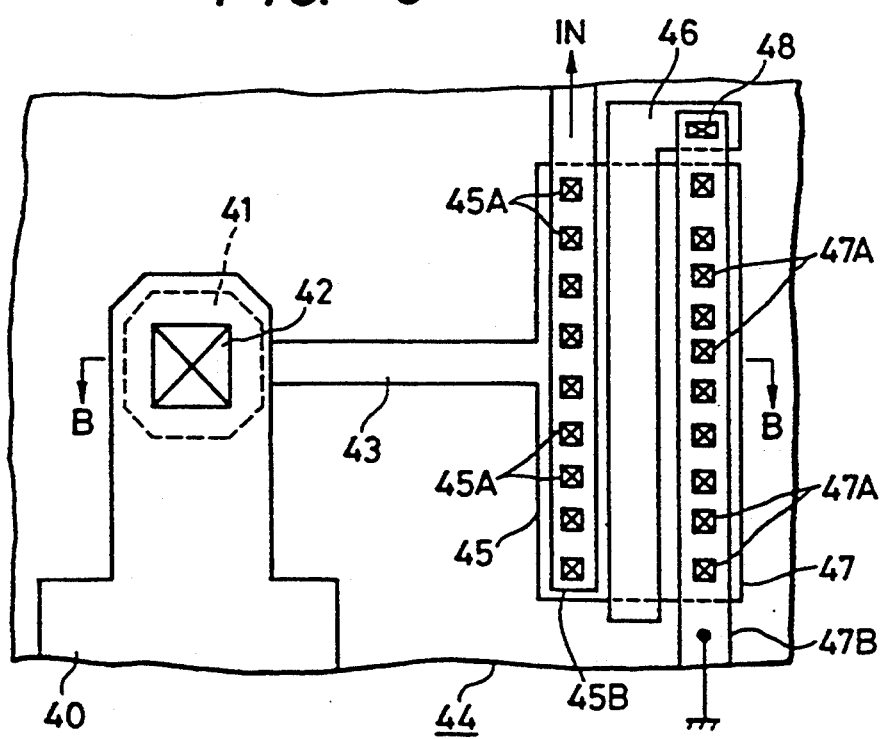
FIGS. 9 and 10 are schematic plan views corresponding to the electrostatic protective circuit and the internal circuit of FIG. 8, respectively.
Figure 10:
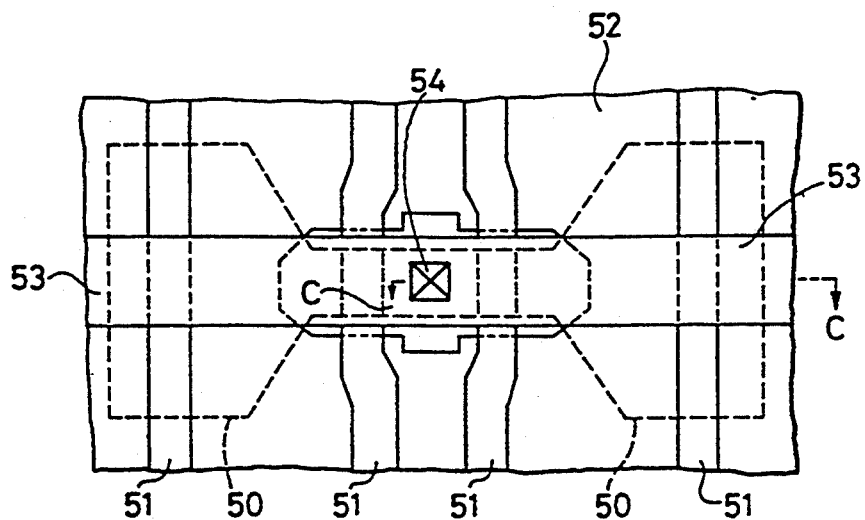

FIGS. 5 through 8 are sections showing, step-by-step, the process of fabricating a semiconductor device exemplary of the present invention. The protective circuit is shown on the left of each drawing and a memory cell, which is part of the internal circuit, is shown on the right. FIG. 8 is a section through a completed semiconductor device, and FIGS. 9 and 10 are schematic plan views of the semiconductor device of FIG. 8.

Figure 1:
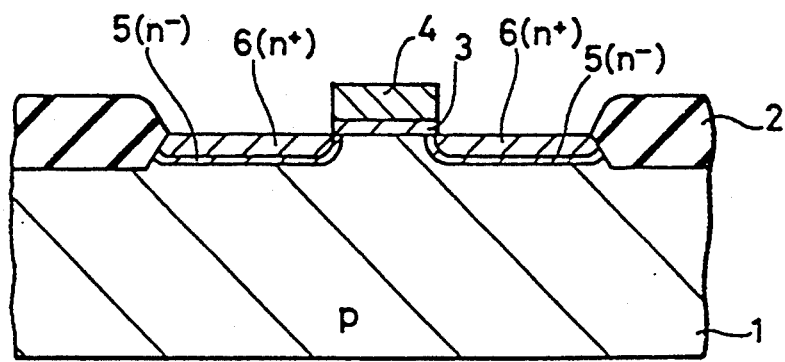
FIG. 1 is a section through an N-channel MIS element of a double-diffused drain structure.
Figure 2:
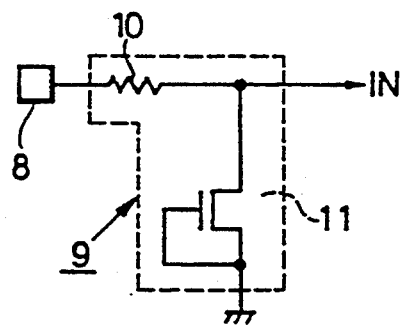
FIG. 2 is an electric equivalent circuit diagram of an example of an electrostatic protective circuit.
Figure 3:
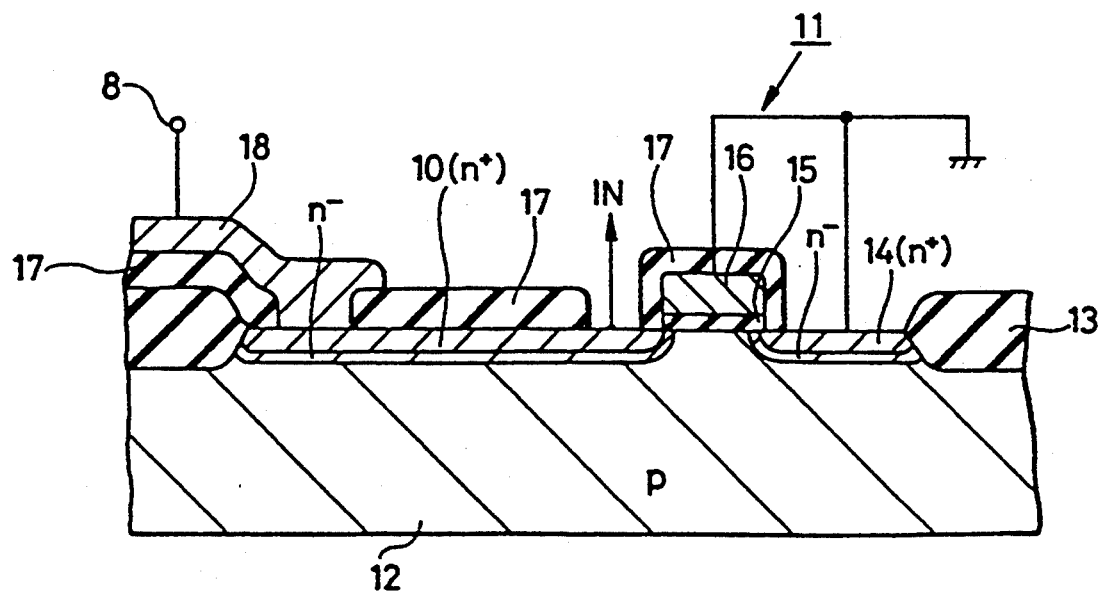
FIG. 3 is a section through a specific device corresponding to the equivalent circuit of FIG. 2.
Figure 5:
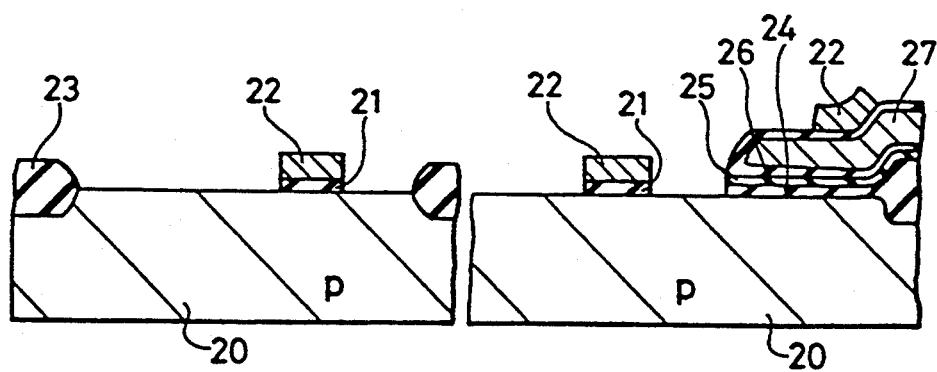
FIGS. 5 through 8 are sections through the semiconductor device, showing the fabrication method in accordance with one embodiment of the present invention.

FIG. 5 is a section showing the state in which the process as far as the formation of the gate electrode of the MOSFET of the DRAM has been completed in accordance with a conventional technique. In the drawing, reference numeral 20 denotes a semiconductor substrate, 21 a gate oxide film, and 22 a gate electrode. The semiconductor substrate 20 is, e.g., a P-type monocrystalline silicon substrate having a (100) crystal plane, for example, and the gate oxide film 21 is an $SiO_2$ film, for example. The gate electrode 22 is a conductive layer forming a second layer, and is formed by depositing polycrystalline silicon by CVD (chemical vapor deposition), and then diffusing phosphorus ions or the like to form polycrystalline silicon of a reduced resistance. The gate electrode may consist of a layer of a metal which has a high melting point, a layer of the silicide of such a metal, or a two-layered structure consisting of polycrystalline silicon and the silicide of a metal with a high melting point. The circuit shown in FIG. 2 is illustrated as an example of the protective circuit on the left of FIG. 5, and the memory cell of the DRAM is shown as an example of the internal circuit on the right of the drawing.

Reference numeral 23 denotes a thick oxide film providing isolation, which is formed by selective thermal oxidation of the surface of the silicon substrate 20, for example. A silicon nitride ($Si_3N_4$) film 25 acting as a dielectric film of a storage capacitor is formed on the surface of the field oxide film 23 formed on the memory cell side, and also on the surface of a thin $SiO_2$ film 24 that continues from the film 23. A polycrystalline silicon electrode 27 is formed on the thin film 25 through an $SiO_2$ film 26 and is diffused with phosphorus ions or the like so as to reduce its resistance. The conductive layer which is the first layer consisting of this polycrystalline silicon electrode 27 forms one of the electrodes of the capacitor of the memory cell. Incidentally, ion implantation for an inversion prevention layer (that is, a channel stopper layer), or for controlling the threshold voltage, etc., has already been completed by this stage.

Next, as shown in FIG. 6, a photoresist film 28 is selectively formed over the surface of the protective circuit alone, by a photolithographic process. More specifically, the photoresist film 28 (1 μm) is formed only over the region A in FIG. 4. Ion implantation is then effected using this photoresist film 28 as a mask, in order to form the $N^-$-type layer of the double-diffused drain structure over the entire surface of the semiconductor device. This ion implantation uses phosphorus ions as the N-type impurity, for example, and forms an $N^-$-type diffusion layer 29 as the source-drain region. Dose is $1 \times 10^{14}/cm^2$ and energy is 50 KeV. Arsenic ions can be used as the impurity.

Referring to FIG. 7, the photoresist film 28 is removed, and then N-type impurity ions such as arsenic ions are implanted to form an $N^+$-type layer 30 of the double-diffused drain structure and a diffusion resistance layer 31 of the protective circuit, as well as a source-drain region 32 of the clamping MOSFET. Dose is $8 \times 10^{15}/cm^2$ and energy is 80 KeV. Phosphorus ions can be used as the impurity.

As can be appreciated, the diffusion resistor can be formed from a polysilicon layer, e.g., formed over the semiconductor substrate.

As can be seen from FIGS. 6 and 7, the protective circuit has a single-diffused drain structure while the internal circuit has a double-diffused drain structure. In this case, the photoresist film 28 is selectively formed to prevent the implantation of the $N^-$-type phosphorus ions into the protective circuit. However, the implantation of phosphorus ions into the protective circuit can also be prevented by controlling the scanning of the ion implantation (to avoid scanning the region including the protective circuit, i.e., region A in FIG. 4) because, since the electrostatic protective circuit is usually formed in the omnipresent arrangement in a certain region around the periphery of the chip, as shown in FIG. 4, it is relatively easy to inhibit the ion implantation scanning by limiting it to avoid this region.

After the electrostatic protective circuit of the single-diffused drain structure and the internal circuit of the double-diffused drain structure have thus been formed, a phosphosilicate glass film (PSG film) 33 and an aluminum layer acting as a third conductive layer are formed as shown in Figure 8. The aluminum layer acts as an output electrode 34 for connection to the diffusion resistor 31, an output electrode 35 for connection to the internal circuit, a source electrode 36, and a data line 37 of the memory cell. Incidentally, after the PSG film 33 is formed, photoetching is used to form contact holes for these electrodes, and aluminum sputtering is done to form the electrodes. Finally, a PSG film 38 is formed as a protective film.

FIGS. 9 and 10 are schematic plan views of the electrostatic protective circuit and internal circuit of FIG. 8, respectively. A section along the line B—B of FIG. 9 and a section along the line C—C of FIG. 10 correspond to the protective circuit region and the internal circuit region of FIG. 8, respectively.

In FIG. 9, reference numeral 40 denotes a bonding pad, 41 a diffusion layer for an input portion, 42 a contact hole, and 43 a diffused resistor. Reference numeral 44 denotes a clamping MOSFET which consists of a region 45 connected electrically to the diffused resistor 43, a gate electrode 46 and a source 47. The region 45 is connected to an Al signal line 45B through contacts 45A, and the Al signal line 45B is electrically connected to the internal circuit. Similarly, the source 47 is connected to an Al line 47B through contacts 47A, and one end of the Al line 47B is connected to the gate electrode through a contact 48, with the other end thereof grounded.

In FIG. 10, reference numeral 50 denotes a boundary line of the field oxide film that defines the active region of the memory cell, and reference numeral 51 denotes a polycrystalline silicon word line, and corresponds to the gate electrode of the MOSFET. Reference numeral 52 denotes polycrystalline silicon acting as one of the electrodes of the capacitor of the memory cell, and 53 denotes an aluminum electrode wired to a contact hole 54 of the data line.

Figure 11:
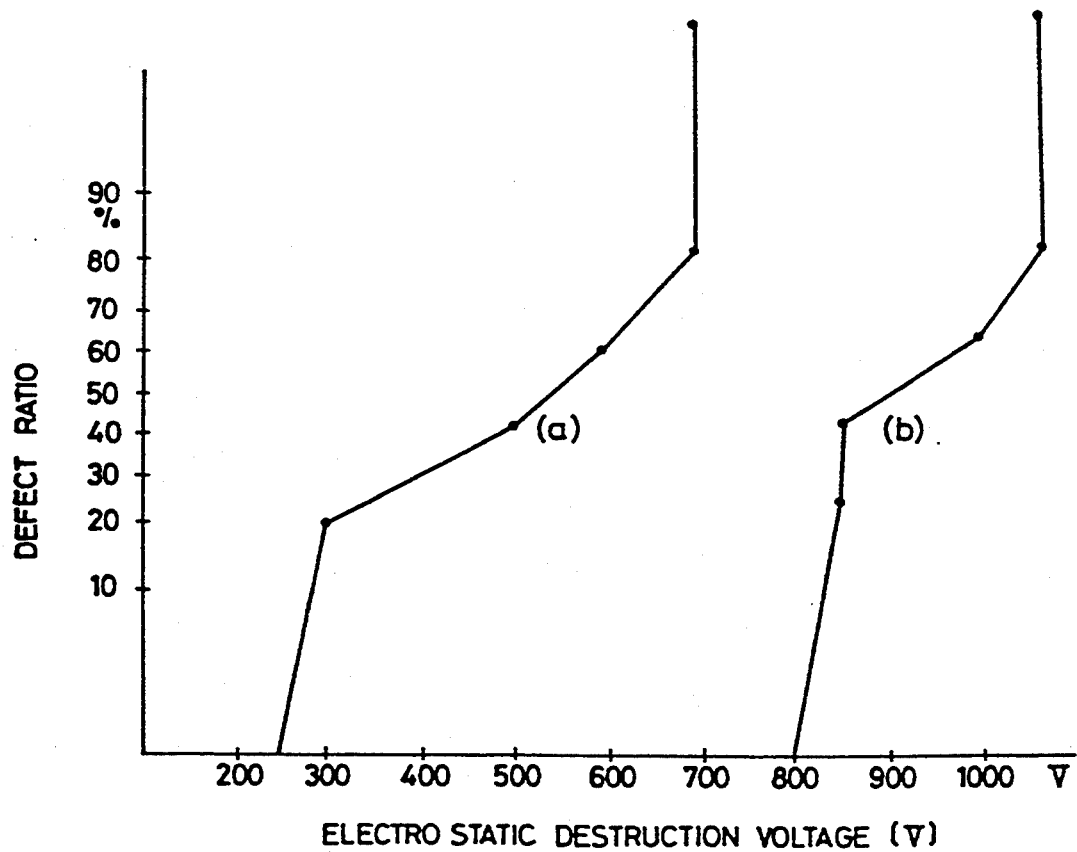
FIG. 11 is a graph of experimental results concerning the dielectric breakdown voltage of an electrostatic protective circuit of a single-diffused drain structure, compared with that of an electrostatic protective circuit of a double-diffused drain structure.
Figure 12:
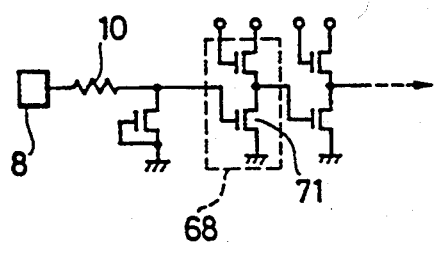
FIG. 12 is a circuit diagram showing an electrostatic protective circuit and specific internal circuit protected thereby.

FIG. 11 is a graph of typical experimental data comparing the electrostatic destruction voltage of a protective circuit with a single-diffused drain structure and that of a protective circuit with the double-diffused drain structure. The percentage accumulative defect ratio is shown along the ordinate, and electrostatic destruction voltage (V) along the abscissa. The segmented line (a) denotes the data on the double-diffused drain structure, and the segmented line (b) that of the single-diffused drain structure. The voltage resistance of the same pin of five samples was examined. It can be understood from the graph that a protective circuit with a single-diffused drain structure exhibits a much better electrostatic destruction voltage.

As described above, since the protective circuit has a single-diffused drain structure and the internal circuit has a double-diffused drain structure, the electric field concentration in the internal circuit and the electric field concentration in the gate oxide film of the first stage MISFET of the internal circuit can be reduced, countering both hot carriers and destruction voltage.

Since a mask is applied to the protective circuit to prevent the formation of one of the diffusion layers of the double-diffused drain, the semiconductor device of this invention can be easily fabricated by adding only one photolithographic step.

If a method is used of locally controlling the ion implantation scanning to avoid the protective circuit that is in an omnipresent arrangement or locally, the present invention can be executed by a simple production process.

Although the afore-described aspect of the present invention has been described specifically with reference to an embodiment thereof, the presently described aspect of the present invention is not particularly limited thereto, but can be worked in various modifications. For example, the protective circuit in the embodiment consists of one diffused resistor and one clamping MOSFET, but it is not particularly limited thereto, and can be applied to various protective circuits that utilize at least the junction breakdown in a diffusion layer and the surface breakdown at the drain end of a clamping MOSFET to improve the dielectric breakdown voltage. Moreover, the clamping MOSFET can be replaced by one or two junction diodes. In this case, the junction of the diode is formed between $N^+$-type layer formed simultaneously with $N^+$-type layer 30, 31 and 32 and p-type substrate.

Figure 13:
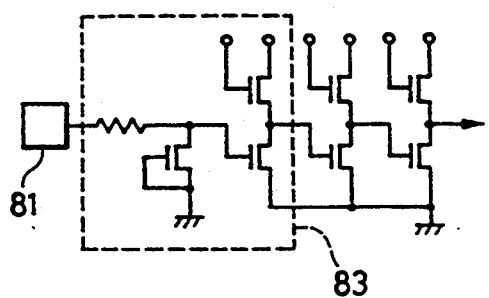
FIGS. 13 and 14 are, respectively, circuit diagrams showing the present invention applied to a MISFET composing a first stage of an input buffer and a MISFET composing a final stage of an output buffer.
Figure 14:
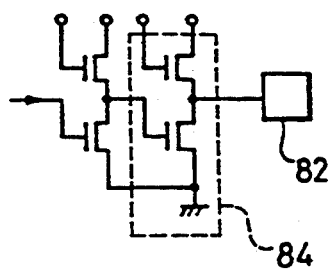

Similarly, a DRAM has been described as an example of the internal circuit, but the internal circuit is not particularly limited to a DRAM, and can be widely applied to circuits provided with MIS elements which have at least a double-diffused drain structure. Thus, this aspect of the present invention can be embodied in a MISFET having a single-diffused drain structure, applied to a MISFET composing the first stage of an input buffer and to a MISFET composing a final stage of an output buffer. As for the circuit diagrams for such MISFETS having the single-diffused structure, applied to the MISFET composing the first stage of an input buffer and the MISFET composing the final stage of an output buffer, see FIGS. 13 and 14, respectively. In these FIGS. 13 and 14, respectively, 81 and 82 represent the input pad and output pad, respectively, and the structure within dotted lines 83, 84 represents the single-diffused drain structure.

Figure 15:
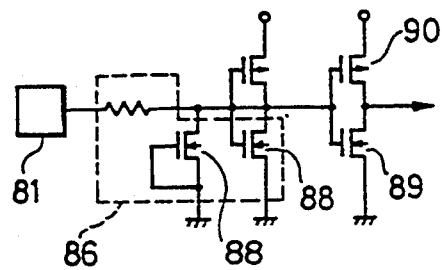
FIGS. 15, 16, and 17 are circuit diagrams showing application of the present invention to CMISICs.
Figure 16:
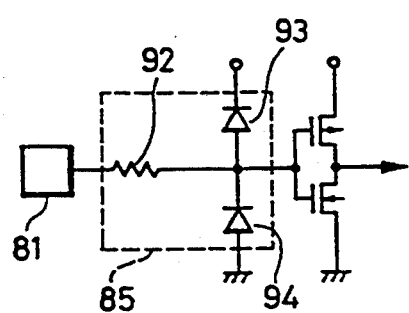
Figure 17:
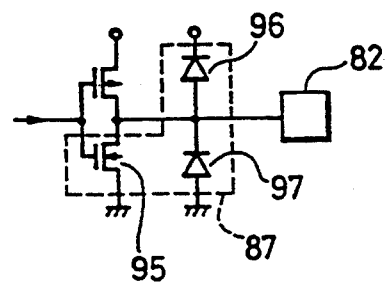
Figure 18:
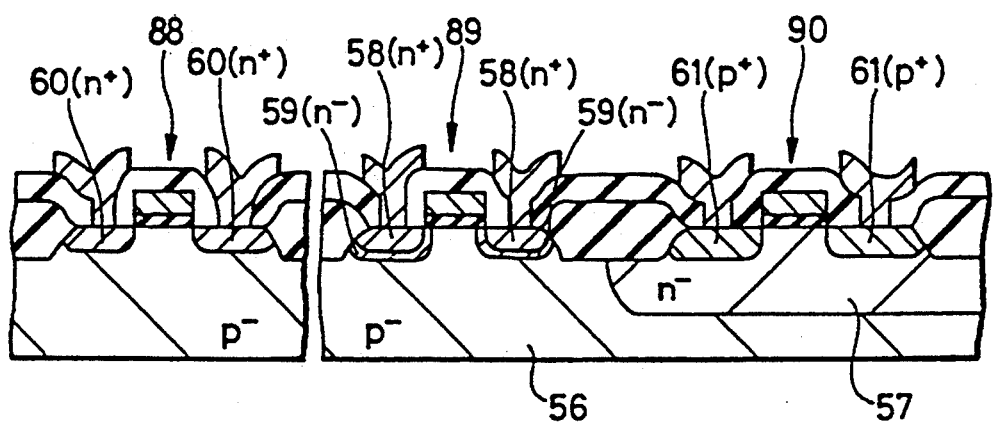
FIG. 18 is a section through a semiconductor device, showing specific structure for the MISFETs of the circuit of FIG. 15.

Moreover, this aspect of the present invention can be applied to N-channel MISFETs of a CMISIC, where N-channel MOSFETs are formed in a P-well region or a P-substrate. FIGS. 15, 16 and 17 show the circuit diagrams for such a CMISIC. The structure within dotted lines 85, 86 and 87 represents the single-diffused drain structure. The structures of MISFETs 88, 89 and 90 in FIG. 15 are shown in FIG. 18. The N-channel MISFET 89 having a double diffused drain structure comprising a $N^+$-type layer 58 and $N^-$-type layer 59 is formed in a $p^-$-type substrate 56. $P^+$-type regions 61 act as source and drain regions of the P-channel MISFET 90 formed in a $N^-$-type well region. The MISFET 88 having a single diffused drain structure of an $N^+$-type layer 60 is formed in the substrate 56. A diode 88 has a same structure as the MISFET 88. Junction diodes 93, 94, 96, 97 are formed between a P-type substrate and a $N^+$-type layer such as the $N^+$-type layer 60 which is formed with single drains of MISFETs simultaneously. In case that a resistor 92 is made of a $N^+$-type layer such as the layer 60, the diode 94 can be formed practically between the resistor 92 and the P-type substrate 56.

Figure 19:
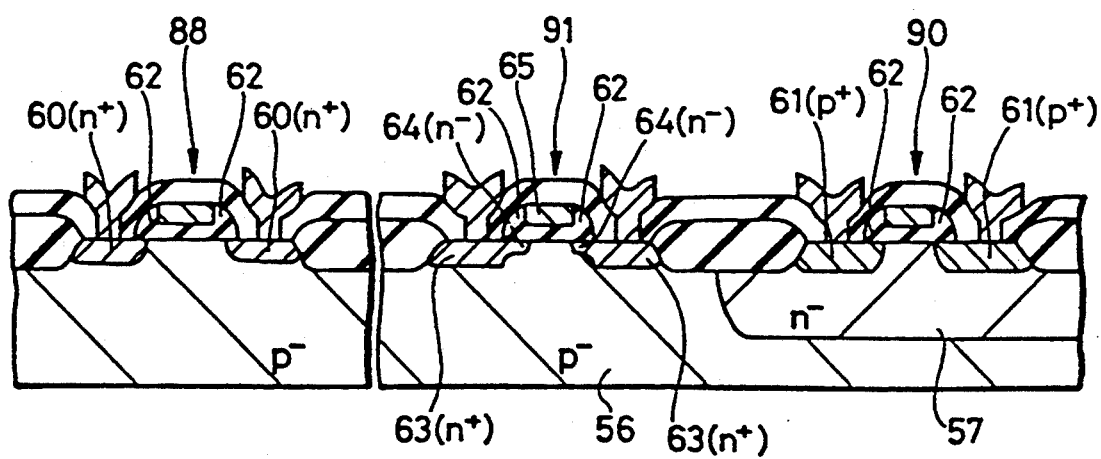
FIG. 19 is a section through a semiconductor device showing further structure to which the present invention can be applied.

Moreover, the invention can be applied to the case that N-channel MISFETs 91 have a structure shown in FIG. 19. The source and/or drain region of the MISFET 91 comprises an $N^-$-type layer 64 formed in self-alignment with a gate electrode 65 and an $N^+$-type layer 62 and the gate electrode 65 (e.g., lightly-doped drain (LDD) structure). The MISFET 91 replaces the MISFET 89, for example.

Thus, while the foregoing description has been directed to a DRAM and its protective circuit, the invention can be widely applied to ordinary MOS integrated circuits such as DRAMS (e.g., 256K bits DRAMS), SRAMs, MOS logic circuits, and so forth.

Figure 20:
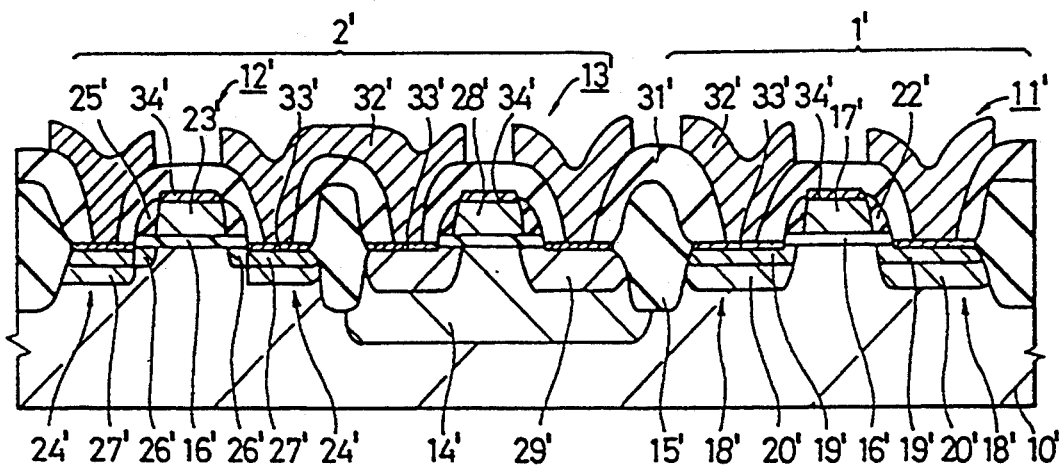
FIG. 20 is a sectional view showing an embodiment of the present invention.

FIG. 20 shows another embodiment, in which the present invention is applied to a semiconductor device, for example, a DRAM constructed of complementary MOSFETS. A region 1' is a region (input/output circuit region) in which an element for an input/output circuit is formed, while a region 2' is a region (internal circuit region) in which elements constituting an internal circuit other than a memory cell are formed.

The figure illustrates the sections of the respective elements.

An NMOSFET 11' is formed as an element of the input/output circuit 1' on a semiconductor substrate 10' made of a P-type silicon single crystal. An NMOSFET 12' and a P-channel MOSFET (hereinbelow, termed PMOSFETI) 13' are respectively formed as elements of the internal circuit 2' on the substrate 10' and an N-type well 14' provided therein. The individual MOSFETs are insulated from one another by a field insulator film (SiO$_2$) 15' which is an element isolating insulator film.

The NMOSFET 11' comprises a gate electrode 17' made of polycrystalline silicon, which is formed on a gate insulator film (SiO$^2$) 16', and N-type regions 18' as source and drain regions, which are provided in the main surface of the substrate 10'. Side wall spacers (insulator films) 22' made of SiO$_2$ are formed on both the sides of the gate electrode 17' by, e.g., depositing a layer of SiO$_2$ on the substrate by the low-pressure CVD (chemical vapor deposition) process and then etching such SiO$_2$ layer by, e.g., reactive ion etching to form the side wall spacers, as is known in the art. However, the MOSFET 11' has no LDD structure. Each of the N-type regions 18' is composed of a region (low concentration phosphorus region) 19' which is doped with phosphorus at a low concentration, and a region (high concentration phosphorus region) 20' which is doped with phosphorus at a high concentration. In the case of this example, the concentrations of the respective phosphorus regions 19' and 20' are $10^{13}$ cm$^{-2}$ (approximately $1\times10^{18}$ cm$^{-3}$) or less and $1-10\times10^{15}$ cm$^{-2}$. In particular, the phosphorus region 20' is set at a concentration of $1-20\times10^{19}$ cm$^{-3}$ or above. The concentration of the phosphorus region 20' needs to be, at least, higher than that of a phosphorus region 26' to be described later. The inventors have verified that, even when the phosphorus regions of such a high concentration are used as the source and drain regions, the appearance of hot carriers is at most only a little, while a strength against electrostatic destruction increases, as will be stated later. In addition, the depths of junctions which the respective regions 19' and 20' define with the substrate 10' are set to 0.2 $\mu$m and 0.5 $\mu$m. The high concentration phosphorus regions 20' have their inner ends diffused to positions under both the ends of the gate electrode 17', into the shape in which they encompass the low concentration phosphorus regions 19' therein.

The NMOSFET 12' comprises a gate electrode 23' made of polycrystalline silicon on a gate insulator film 16', and N-type regions 24' as source and drain regions. Side wall spacers 25' are formed on both the sides of the gate electrode 23'. Each of the N-type regions 24' is composed of the low concentration phosphorus region 26', and a region (arsenic region) 27' which is doped with arsenic at a high concentration. In particular, the arsenic region 27' is formed so as to be apart (spaced) from a projection of the gate electrode 23' in the main surface of the substrate 10' by the side wall spacer 25', and the low concentration phosphorus region 26' is formed so as to extend under the side wall spacer 25'. Thus, the so-called LDD structure is established. The concentration of the low concentration phosphorus region 26' is at most $10^{13}$ cm$^{-2}$ (approximately $1\times10^{18}$ cm$^{-3}$), and that of the arsenic region 27' is $5-10\times10^{15}$ cm$^{-2}$ ($1-4\times10^{20}$ cm$^{-3}$). The depths of junctions which the respective regions 26' and 27' define with the substrate 10' are 0.2 $\mu$m and 0.2-0.3 $\mu$m.

The PMOSFET 13' comprises a gate electrode 28' made of polycrystalline silicon on a gate insulator film 16', and P-type regions 29' as source and drain regions formed in the N-type well 14'. In this example, the PMOSFET 13' is not of the LDD structure. The P-type regions 29' are formed by doping with boron at a concentration of approximately $5\times10^{15}$ cm$^{-2}$.

Layers 33' and 34' of a silicide of platinum or a refractory metal are respectively formed on the surfaces of the source and drain regions 18', 24' and 29' and the gate electrodes 17', 23' and 28'. In the figure, numeral 31' designates an inter-layer insulator film which is made of phosphosilicate glass (PSG) or the like, and numeral 32' a wiring layer which is made of aluminum.

Figure 25:
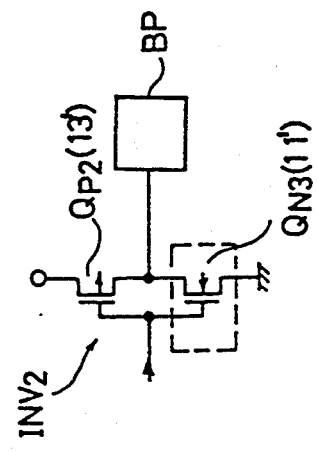
FIGS. 24 and 25 are circuit diagrams showing, respectively, examples of input and output circuits to which the present invention is applied.
Figure 24:
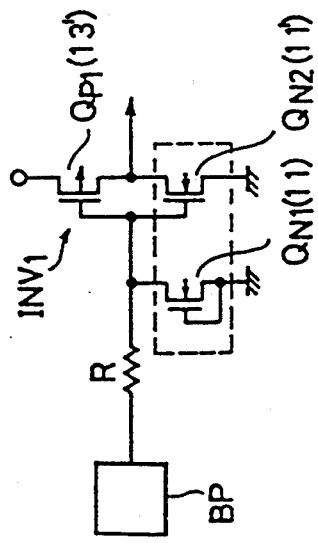

FIG. 24 is a diagram showing an input circuit, while FIG. 25 is a diagram showing an output circuit, and they exemplify the input/output circuits 1' respectively. As seen from FIGS. 24 and 25, the input/output circuits 1' are circuits which are connected to bonding pads BP. NMOSETs $Q_{N1}$-$Q_{N3}$ and PMOSFETS $Q_{p1}$, $Q_{P2}$ are respectively put into the same structures as those of the NMOSFET 11' and the PMOSFET 13'. The internal circuit 2' includes a portion except for the input/output circuits 1' and the memory cell, in other words, a circuit such as decoder, sense amplifier, main amplifier or any of various signal generators.

In the present embodiment, the NMOSFET of the memory cell is put into the same structure as that of the NMOSFET 12'.

According to this construction, in the NMOSFET 12' in the internal circuit 2', the N-type region 24' is formed into the LDD structure by the arsenic region 27' and the low concentration phosphorus region 26', so that an electric field at the edge of the drain region 24', can be moderated so as to suppress the appearance of hot carriers. As a result, fluctuation of a threshold voltage can be prevented so as to enhance the reliability of characteristics in the internal circuit 2'.

On the other hand, in the NMOSFET 11' of the input/output circuit 1', the source or drain region (N-type region) 18' is formed of the high concentration phosphorus region 20' encompassing the low concentration phosphorus region 19', so that the reverse breakdown voltage of the junction between the high concentration phosphorus region 20' and the substrate 10' becomes small. Thus, the destruction voltage of the gate insulator film against electrostatic destruction can be enhanced.

By setting the source and drain regions 18' at the high impurity concentration, the electric field strength is raised. Since, however, the impurity is phosphorus, the impurity concentration gradient is gentle, and hence, the appearance of hot carriers as in the case of arsenic is not involved. Of course, in the input/output circuits, the influences of the hot carriers are originally only a little on the basis of the relations between element sizes and voltages to be applied.

Further, owing to the use of the silicide layer 33' it is possible to reduce the resistance of the semiconductor region 18' and to raise the operating speed of the element even when phosphorus is employed as the impurity.

Next, a method of manufacturing the semiconductor device of the above construction will be described with reference to FIGS. 21A-21G.

Figure 21A:
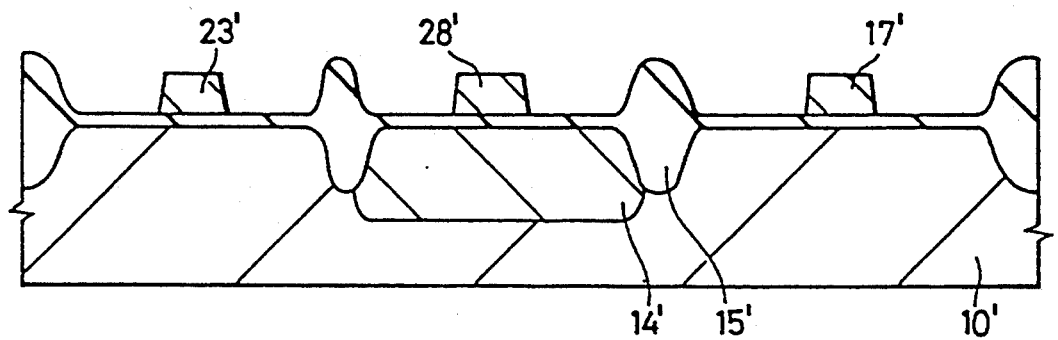
FIGS. 21A–21G are sectional views showing a manufacturing process for the embodiment in FIG. 20.

First, as shown in FIG. 21A, an N-type well 14' is formed in a semiconductor substrate 10' made of a P-type silicon single crystal, and an element isolating insulator film (field insulator film) 15' and a gate insulator film 16' are formed. Polycrystalline silicon is deposited on the whole surface of the substrate by CVD and is patterned to form gate electrodes 17', 23' and 28' of respective MOSFETs 11', 12' and 13'

Figure 21B:
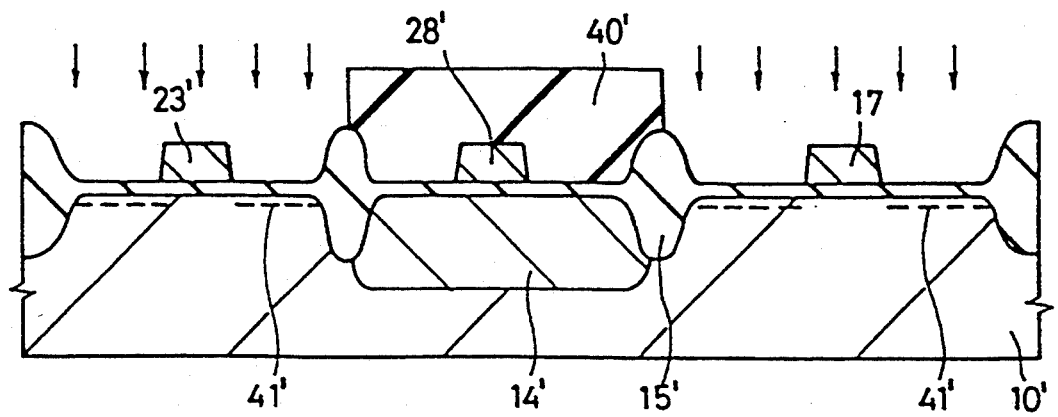

Subsequently, as shown in FIG. 21B, under the state under which the portion of the substrate for forming the PMOSFET 13' is masked by a photoresist film 40', phosphorus at a low concentration ($10^{13}$ cm$^{-2}$ or less) is ion-implanted into the whole surface by employing the gate electrodes 17' and 23' as a mask. As an example, the phosphorus can be ion-implanted at a concentration of $1 \times 10^{13}$ cm$^{-2}$ and an implantation energy of 60 KeV. Thus, low-concentration ion-implanted layers 41' are formed. At this time, an input/output circuit domain 1' may well be covered with the photoresist film 40' so as to prevent the phosphorus from being introduced into the source and drain regions of the NMOSFET 11'.

Figure 21C:
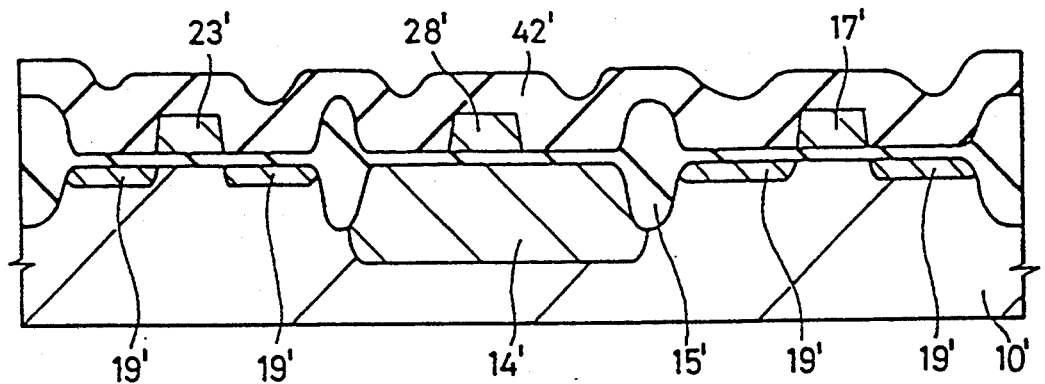

After removing the photoresist film 40', the resultant structure is annealed thereby to form low concentration phosphorus regions 19' and 26' in the respective NMOSFETs 11' and 12' as shown in FIG. 21C. Such annealing can be performed, for example, at a temperature of 950° C., in a nitrogen (N$_2$) atmosphere, for 10–30 minutes. An SiO$_2$ film 42' is formed on the whole surface of the substrate by the low-pressure CVD process or the like.

Figure 21D:
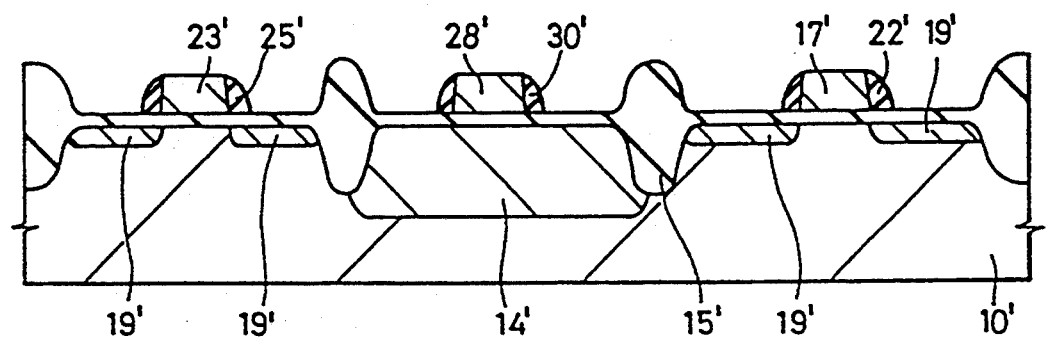

The SiO$_2$ film 42' is etched by reactive ion etching (RIE), whereby side wall spacers 22', 25' and 30' are respectively formed on both sides of the gate electrodes 17', 23' and 28', as shown in FIG. 21D.

Figure 21E:
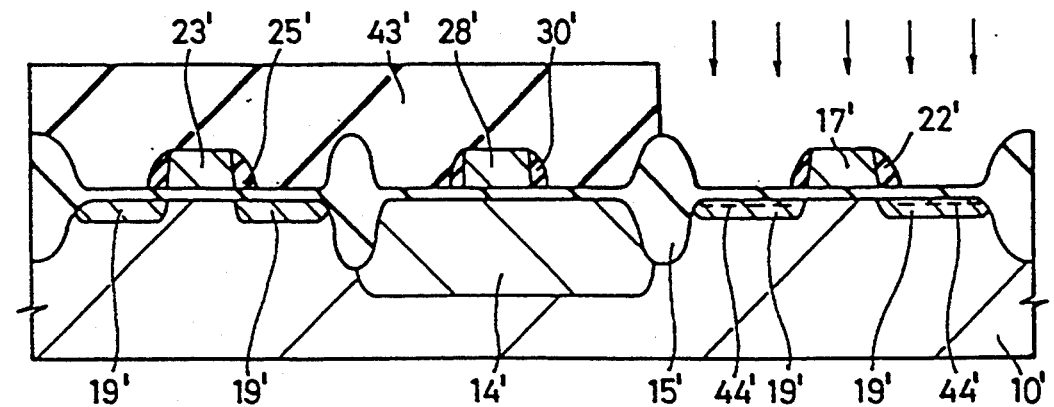

Next, as shown in FIG. 21E, under the state under which an internal circuit region 2', namely, the portion of the substrate for forming the NMOSFET 12' as well as the portion of the substrate for forming the PMOSFET 13', is masked by a photoresist film 43', phosphorus at a high concentration ($1-10 \times 10^{15}$ cm$^{-2}$) is ion-implanted by employing the gate electrode 17' and the side wall spacers 22' as a mask. As an example, phosphorus can be ion-implanted at a high concentration of $5 \times 10^{15}$ cm$^{-2}$, at an implantation energy of 100 KeV. Thus, layers 44' ion-implanted with the high concentration of phosphorus are formed.

Figure 21F:
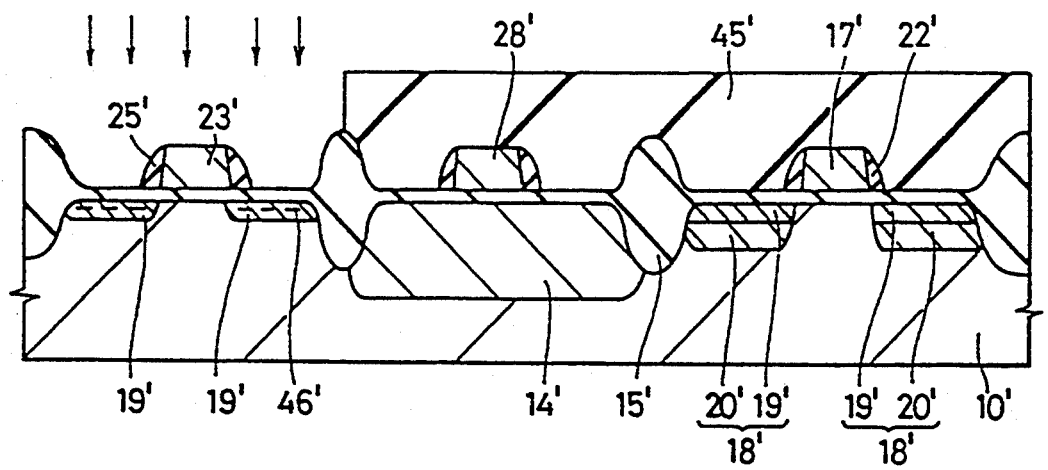

After removing the photoresist film 43', the resultant structure is annealed, by a conventional technique (e.g., annealing is performed at 950° C. in a nitrogen (N$_2$) atmosphere for 10–30 minutes), thereby to form source and drain regions 18' made up of high concentration phosphorus regions 20' encompassing the low concentration phosphorus regions 19' as shown in FIG. 21F.

Alternatively, the phosphorus for the high concentration phosphorus regions 20' can be implanted without use of side wall spacers 22', and particularly, prior to forming the side wall spacers 22'. Thus, layers 44' can be ion-implanted before or after forming low concentration phosphorus regions 19' (e.g., prior or after ion-implanting layers 41'), without the side wall spacers.

Thus, layers 44' can be ion-implanted in the state of FIG. 21B. In this case, since the regions 20' diffuse from an edge of gate electrode 17' and include regions 19', even if layers 44' are implanted to make a shallow junction, the implantation energy for forming layers 44' can be reduced to, e.g., 50 KeV.

Thereafter, as shown in FIG. 21F, under the state under which the portion of the substrate for forming PMOSFET 13' and the input/output circuit region 1' are masked by a photoresist film 45', arsenic is ion-implanted at a concentration of $5-10 \times 10^{15}$ cm$^{-2}$ by employing the gate electrode 23' and the side wall spacers 25' as a mask. As an example, arsenic can be ion-implanted at such concentration of $5-10 \times 10^{15}$ cm$^{-2}$ and an implantation energy of 80 KeV. Thus, arsenic ion-implanted layers 46' are formed for the NMOSFET 12'.

Figure 21G:
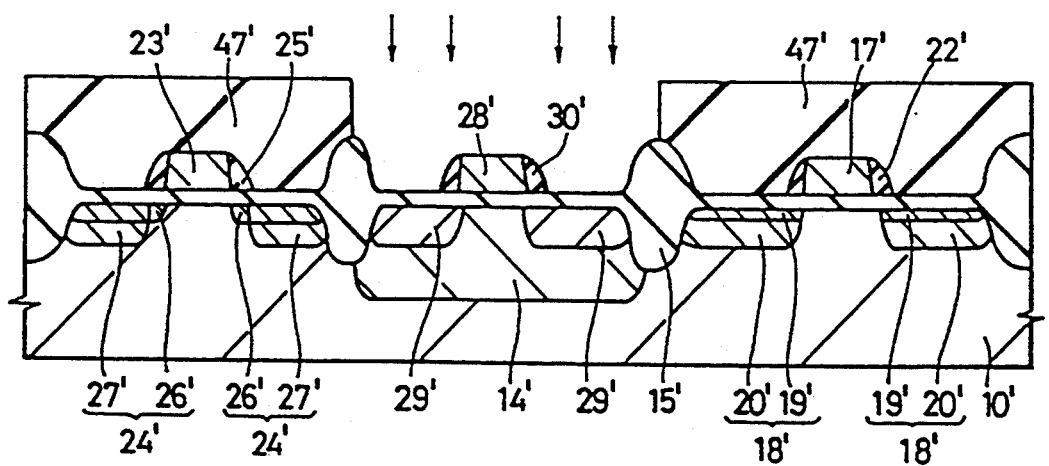

By annealing after the removal of the photoresist film 45', using conventional annealing as discussed previously, arsenic regions 27' are formed as shown in FIG. 21G. That is, the source and drain regions 24' of the NMOSFET 12' of the internal circuit 2' are finished up as the LDD structures.

Subsequently, as shown in FIG. 21G, under the state under which the NMOSFETs 11' and 12' are masked by a photoresist film 47', boron (B) is ion-implanted at a concentration of $5 \times 10^{15}$ cm$^{-2}$ by employing the gate electrode 28' and the side wall spacers 30' as a mask. As an example, BF$_2$ can be ion-implanted at a concentration of $5 \times 10^{15}$ cm$^{-2}$ at an implantation energy of 60–80 KeV. Thus, boron-implanted layers are formed. By annealing (e.g., conventional annealing, as discussed previously) after the removal of the photoresist film 47', P$^+$-type regions 29' as source and drain regions are formed. Thereafter, the parts of the insulator film 16' on the source and drain regions are removed. Subsequently, a metal film of molybdenum (Mo) or the like (e.g., other refractory metals, and platinum) is formed on the whole surface of the resultant substrate and is heat-treated into a silicide, and the unreacted parts of the metal film are removed, whereby silicide layers 33' and 34' are formed, as is known in the art.

As an alternative annealing technique to the aforementioned separate annealing after each ion-implantation, the structure can be subjected to an annealing after all ion-implantations have been completed. In such alternative technique, the annealing, performed, e.g., at 950° C. in a nitrogen (N$_2$) atmosphere, should be performed for 30–60 minutes.

Thenceforth, an inter-layer insulator film 31', aluminum wiring 32' and final passivation film (not shown) are formed by well-known processes, whereby the semiconductor device in FIG. 20 can be completed.

With this method, the NMOSFET of the input/output circuit can be readily formed merely by adding the masking step of the photoresist film 43' and the doping step of the high concentration phosphorus as shown in FIG. 21E, to the steps of fabricating the NMOSFET (12') of the LDD structure. Besides, in forming the high concentration phosphorus regions 20', the side wall spacers 22' are utilized, and hence, the high concentration phosphorus regions 20' can be formed into a required depth. Also, the channel length can be readily formed into a required length, and an increase in the channel length is not incurred, which is effective for microminiaturization.

Figure 22:
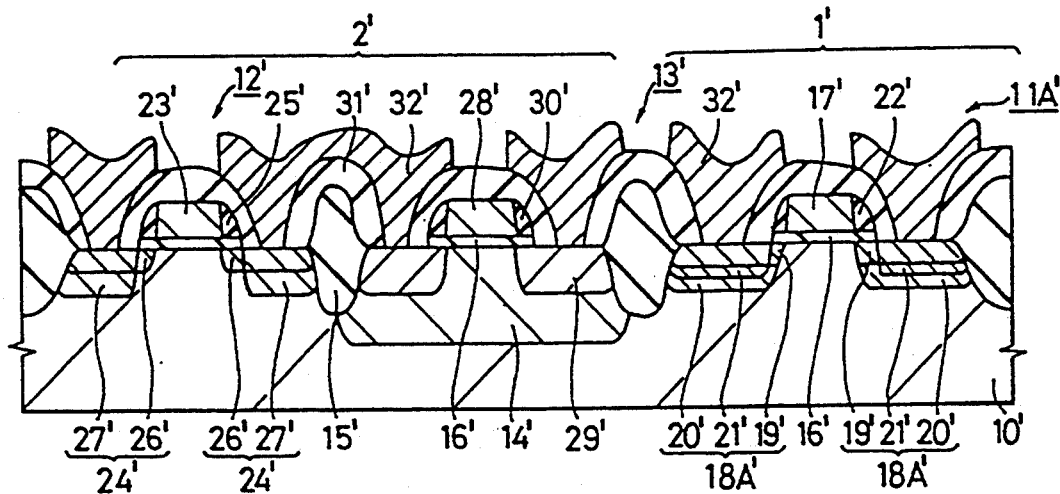
FIG. 22 is a sectional view of another embodiment of the present invention.

FIG. 22 shows another embodiment of the present invention. In the figure, the same portions as in FIG. 20 are assigned the same symbols, and they shall not be repeatedly explained.

In this example, each of N-type regions 18A' as the source and drain regions of the NMOSFET 11A' of an input/output circuit 1' comprises a low concentration phosphorus region 19', a high concentration phosphorus region 20' so as to substantially encompass the region 19', and an arsenic region 21' which is formed on the surface side of the region 20' and shallower than this region 20' and to be apart from a gate electrode 17' (that is, spaced from a vertical projection of gate electrode 17' on the substrate). The concentrations of the phosphorus regions 19' and 20' are the same as in the foregoing example, and the concentration of the arsenic region 21' is the same as that of the arsenic region 27' of the NMOSFET 12' of an internal circuit 2'. The depths of the respective regions 19', 20' and 21' are 0.2 μm, 0.5 μm and 0.2–0.3 μm.

Figure 23A:
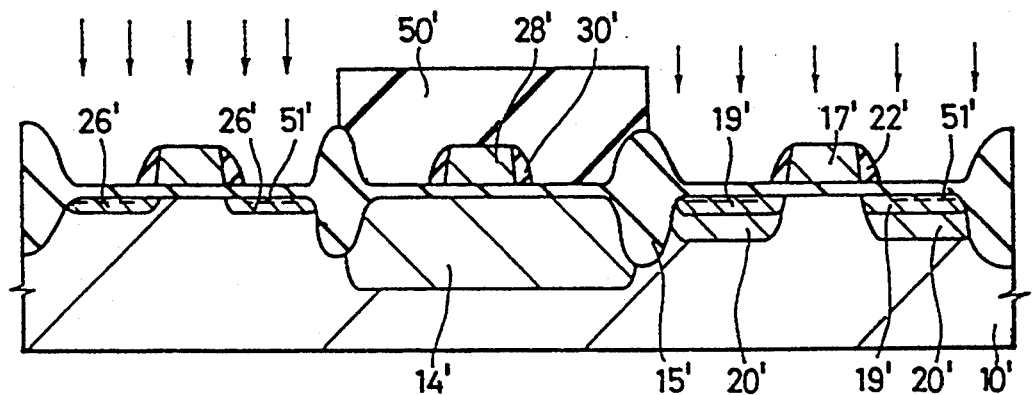
FIGS. 23A and 23B are sectional views showing some steps of a manufacturing process for the embodiment in FIG. 22.

A method of manufacturing this semiconductor device is as follows. First, the steps of FIG. 21A–FIG. 21E in the foregoing example are carried out. Thereafter, as shown in FIG. 23A, under the state under which only the portion of the substrate for forming PMOSFET 12' of the internal circuit 2' is covered with a mask of photoresist 50', arsenic is ion-implanted at a concentration of $5-10 \times 10^{15}$ cm$^{-2}$, at an implantation energy of, e.g., 80 KeV. Arsenic ion-implanted layers 51' formed for both the NMOSFETs 11A' and 12' are annealed, and the arsenic regions 21' and 27' being apart with respect to the corresponding gate electrodes 17' and 23' can be formed. Thus, the above-stated construction of the source and drain regions 18A' is obtained in the NMOSFET 11A', and the LDD structures are obtained in the NMOSFET 12'.

Figure 23B:
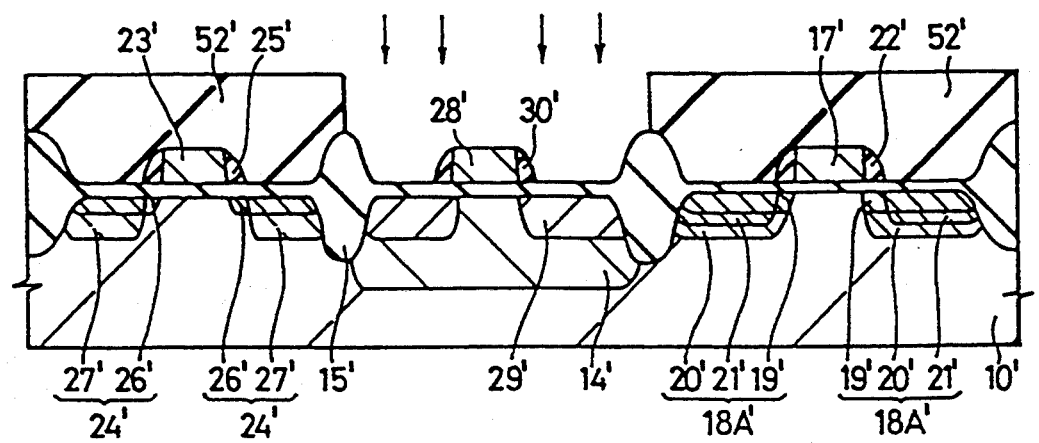

Subsequently, as shown in FIG. 23B, the NMOSFETs 11A' and 12' are masked by the use of a photoresist film 52', and if necessary, side wall spacers 30' are etched and removed, whereupon boron is ion-implanted. By subsequent annealing, source and drain regions 29' are formed.

Thereafter, an inter-layer insulator film 31', aluminum wiring 32' and final passivation film are formed, whereby the semiconductor device in FIG. 22 is finished up.

According to this example, the NMOSFET 12' of the internal circuit 2' is formed in the LDD construction as in the preceding example, so that the appearance of hot carriers is suppressed. On the other hand, in the NMOSFET 11A' of the input/output circuit, the main constituents of the source and drain regions 18A' are the high concentration phosphorus regions 20' extended to both the ends of the gate electrode 17', so that the electrostatic destruction voltage can be enhanced. Moreover, the regions 20' have a high impurity concentration but use phosphorus, so that lowering of the hot carrier generation can be suppressed.

Further, since arsenic regions 21', which are spaced apart from the projection of the gate electrode, are included in the source and drain regions 18A', the overlap of the high concentration phosphorus regions 20' with the gate electrode 17' can be made smaller than in the preceding example, and the transconductance can be enhanced owing to reduction in the junction capacitances. Of course, the operating speed can also be raised by the lowered resistances of the source and drain regions 18A' owing to the arsenic regions 21'.

Even in a case where the high concentration phosphorus regions 20' do not get to both sides of the gate electrode 17', the low concentration phosphorus regions 19' previously formed have been formed by utilizing the gate electrode 17' and reliably extend to under this gate electrode, so that the MOS structure is not spoiled.

According to this aspect of the present invention, the following effects are produced.

In a semiconductor device whose internal circuit has a MOSFET of the LDD structure, the source and drain regions of a MOSFET for an input/output circuit are so constructed as to be doped with phosphorus at a high concentration, so that the electrostatic destruction voltage can be enhanced.

Since source and drain regions are constructed by the use of phosphorus at a high concentration, the concentration gradient is gentle in spite of the high impurity concentration, and the appearance of hot carriers can be suppressed.

Since the concentration of phosphorus in the input/output circuit is made as high as $1-20 \times 10^{19}$ cm$^{-3}$, the appearance of hot carriers can be suppressed, and the electrostatic destruction voltage can be enhanced.

Only an input/output circuit is provided with regions made by the use of a high concentration of phosphorus, and other semiconductor devices of the integrated circuit are formed in the LDD structure, so that even when the junction capacitances between a substrate and the phosphorus regions increase, the operating speed of the whole IC does not decrease.

Since source and drain regions are formed with arsenic regions, resistances can be reduced to achieve an increased speed.

Since source and drain regions are provided with silicide layers, resistances can be reduced to achieve an even further increased speed.

Since source and drain regions are formed with arsenic regions spaced from a projection of a gate electrode, the overlap between phosphorus regions and the gate electrode can be diminished, and junction capacitances can be reduced to enhance a transconductance.

Since the overlap between a gate electrode and high concentration phosphorus regions can be diminished, a gate length relative to an effective gate length is shortened, which is effective for the microminiaturization of an element.

Under the state in which at least an internal circuit is masked, doping with a high concentration of phosphorus is carried out by utilizing side wall spacers, whereupon doping with arsenic is carried out for at least the internal circuit by utilizing the side wall spacers. Thus, the LDD structures can be formed in the internal circuit, and source and drain regions of the high concentration of phosphorus can be formed in an input/output circuit. A semiconductor device according to this aspect of the present invention can be readily manufactured by adding the step of masking, and the step of doping with the high concentration of phosphorus, to a process for manufacturing an NMOSFET of the LDD structure.

An impurity is introduced by doping beforehand with a gate electrode used as a mask. Therefore, even when the diffusion of a high concentration of phosphorus is insufficient in case of doping with the high concentration of phosphorus, the MOS structure is not spoiled.

While, in the above, the invention made by the inventors has been concretely described in conjunction with embodiments, it is needless to say that this aspect of the present invention is not restricted to the foregoing embodiments but that it can be variously modified within a scope not departing from the purport thereof.

The present invention is effective for a MOSFET, e.g., QN1 or $Q_{N3}$ (see FIGS. 24 and 25) whose drain is connected to a bonding pad, especially a bonding pad to which an input or output signal is applied. The reason is that electrostatic breakdown is liable to occur in a circuit connected to the bonding pad to which the input or output signal is applied.

Accordingly, the MOSFET $Q_{N2}$ in FIG. 24 need not be put into the same structure as that of the MOSFET 11'. To the contrary, the present invention is also applicable to an NMOSFET constituting a circuit of the next stage which is connected to an inverter $INV_1$, or $INV_2$ constructed of the MOSFET $Q_{N1}$ or $Q_{N3}$. Further, it is possible that only the drain region of an N-channel MOSFET such as the MOSFET $Q_{N1}$ or $Q_{N3}$ is put into the structure conforming with the present invention.

Figure 26:
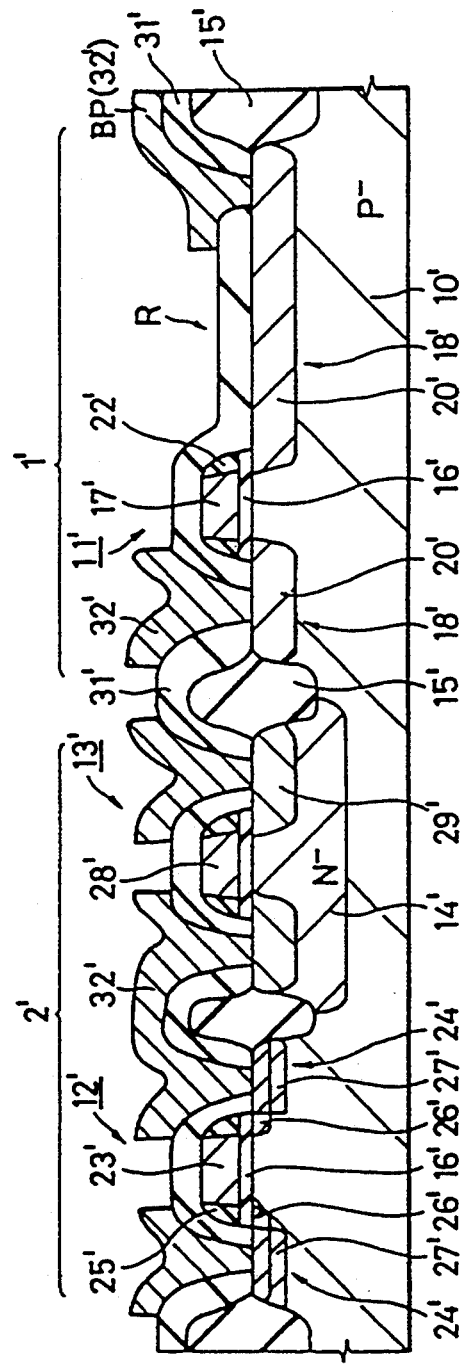
FIG. 26 a sectional view showing still another embodiment of the present invention.

The low impurity concentration regions 19' in the MOSFET 11' can be omitted. As shown in FIG. 26, each of the source and drain regions 18' of the MOSFET 11' is made up of only the phosphorus region 20' of high impurity concentration. This can be achieved in such a way that the resist mask 40' shown in FIG. 21B is formed so as to cover the input/output circuit domain 1'. That is, the number of manufacturing steps does not increase in a CMOSIC. In an IC (NMOSIC) which is constructed of NMOSFETs without having the PMOSFET 13, a masking step needs to be added.

As shown in FIG. 26, the layers 33' and 34' of the silicide of platinum or a refractory metal can be omitted.

An input protective resistor R shown in FIG. 24 can be formed by extending the source or drain region 18' of the MOSFET 11'. In case of forming a resistor R made of a semiconductor region which is identical and continuous to the region 18', the structure shown in FIG. 26 is desirable. That is, the source and drain regions 18' of the MOSFET 11' are constructed only of the phosphorus regions 20'. The resistor R is formed by extending either phosphorus region 20'. In order to bring the sheet resistance of the region 20' to a proper value (the proper value being that presently used in the art), the silicide layer 33' is not formed. For the same reason, at least the arsenic region 27' is not formed. Accordingly, the resistor R can be formed in a small area. One end of the resistor R is connected to the bonding pad BP which is made of the aluminum layer 32'.

Figure 27:
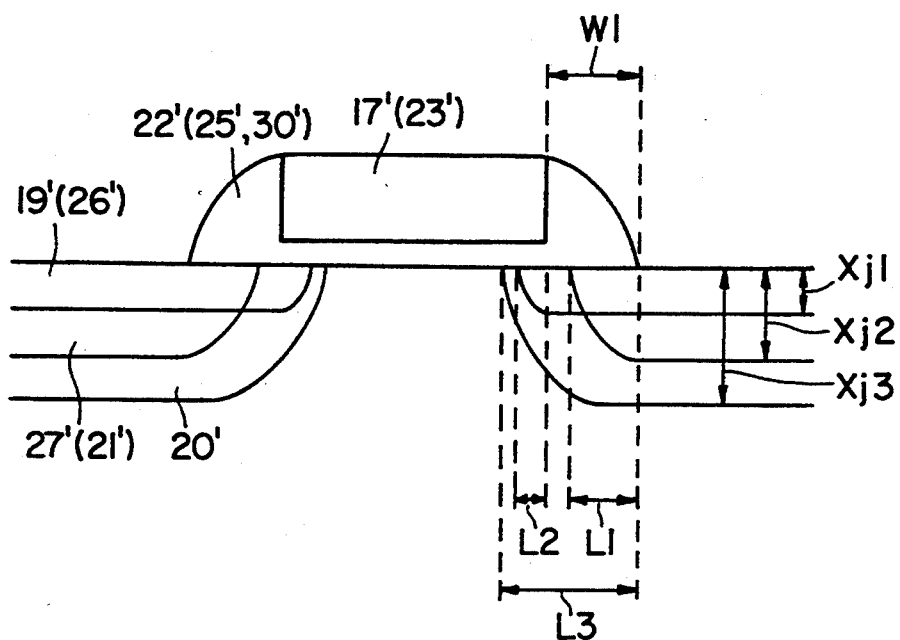
FIG. 27 is a schematic view for explaining exemplary dimensions for he structure of the present invention.

Referring to FIG. 27, various exemplary dimensions for a semiconductor device formed by the present invention will be given. Thus, the width (W1) from an edge of gate electrode 17' (or gate electrodes 23' or 28') to the edge of side wall 22' (or side walls 25' or 30') can be 0.25 $\mu$. The depth $X_{j1}$ of the $N^-$-type semiconductor layers 19' and 26' can be 0.15 $\mu$. The depth $X_{j2}$ of the $N^+$-type semiconductor layers 21' and 27' can be 0.2 $\mu$. The depth $X_{j3}$ of the $N^+$-type semiconductor layer 20' can be 0.5 $\mu$. The overlapping length $L_1$ between, e.g., side wall spacer 22' and $N^+$-type semiconductor layers 21' and 27' can be 0.14 $\mu$. The overlapping length $L_2$ between the gates 17' and 16', and the $N^-$-type semiconductor regions 19' and 26', respectively, can be 0.1 $\mu$. And the overlapping length $L_3$ between gate 17', side wall spacer 22' and $N^+$-type semiconductor layer 20' can be 0.35 $\mu$.

While, in the above, this aspect of the present invention made by the inventors has been chiefly described with respect to its application to semiconductor devices of the CMOS type which form the background field of utilization, it is not restricted thereto. This aspect of the present invention is applicable to a memory IC and also a logic IC other than a DRAM as long as a MOSFET of the LDD structure is included in an internal structure. Moreover, it is applicable, generally, to semiconductor devices having MOSFETs of LDD structure together with other MOSFETS, in a semiconductor substrate. Further, it is applicable, not only to CMOS-ICS, but also to NMOSICS. The LDD structure in this aspect of the present invention may include, at least, a first semiconductor region having a high impurity concentration, and a second semiconductor region which has an impurity concentration lower than that of the first semiconductor region and which is formed closer to a channel side (gate electrode side) than the first semiconductor region. The first semiconductor region need not be deeper than the second semiconductor region. A bonding pad includes not only a pad for wire bonding, but also a pad for bonding which utilizes a bump electrode or the like. Various semiconductor regions may well be opposite in conductivity type to the foregoing. The concentrations of phosphorus and arsenic can be variously altered within the scope of the purport of the present invention.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A semiconductor integrated circuit device, comprising:
   an input pad on a semiconductor substrate;
   a first MISFET which is an input protective element, said first MISFET having a first gate insulating film on said semiconductor substrate and a first gate electrode, with opposed edges, on said first gate insulating film, and further having source and drain regions and a first channel region in said semiconductor substrate, said drain region having a first semiconductor region, forming an edge of said drain region, in contact with said first channel region, said source region having a second semiconductor region in contact with said first channel region, said first gate electrode and said second semiconductor region being electrically connected to ground potential; and
   a second MISFET which is a first stage inverter, said second MISFET having a second gate insulating film on said semiconductor substrate and a second gate electrode, with opposed edges, on said second gate insulating film, and further having source and drain regions and a second channel region in said semiconductor substrate, one of the source and drain regions including a first doped subregion of relatively high impurity concentration and a second doped subregion of relatively low impurity concentration, said first and second doped subregions including impurities of the same conductivity type as said first and second semiconductor regions, said second doped subregion being between said first doped subregion and the second channel region and in contact with the second channel region, said second doped subregion forming an edge of said one of the source and drain regions, said second gate electrode and said first semiconductor region being electrically connected to said input pad, an impurity concentration of said first semiconductor region being larger than that of said second doped subregion, said first gate insulating film having a same film thickness as that of said second gate insulating film.

2. A semiconductor integrated circuit device according to claim 1, wherein said second doped subregion surrounds said first doped subregion in said semiconductor substrate.

3. A semiconductor integrated circuit device according to claim 1, further comprising:
sidewall spacers formed at said opposed edges of said second gate electrode, said second doped subregion being in self-alignment with said second gate electrode, and said first doped subregion being in self-alignment with one of said sidewall spacers.

4. A semiconductor integrated circuit device according to claim 1, wherein said first and second MISFETs are n-channel MISFETs.

5. A semiconductor integrated circuit device according to claim 1, further comprising:
a third MISFET having a third gate insulating film on said semiconductor substrate and a third gate electrode on said third gate insulating film, and further having source and drain regions and a third channel region in said semiconductor substrate, said source and drain regions of said third MISFET having a conductivity type opposite to that of said first semiconductor region, said third MISFET and second MISFET being connected in series, said third gate electrode being electrically connected to said second gate electrode.

6. A semiconductor integrated circuit device according to claim 5, wherein said first and second MISFETs are n-channel MISFETs, and said third MISFET is a p-channel MISFET.

7. A semiconductor integrated circuit device according to claim 1, further comprising:
a resistive element electrically connected between said first semiconductor region and said input pad.

8. A semiconductor integrated circuit device according to claim 7, wherein said resistive element is integrally formed with said first semiconductor region.

9. A semiconductor integrated circuit device according to claim 3, further comprising:
a third MISFET having a third gate insulating film on said semiconductor substrate and a third gate electrode on said third gate insulating film, and further having source and drain regions and a third channel region in said semiconductor substrate, said source and drain regions of said third MISFET having a conductivity type opposite to that of said first semiconductor region, said third MISFET and second MISFET being connected in series, said third gate electrode being electrically connected to said second gate electrode.

10. A semiconductor integrated circuit device according to claim 9, wherein said first and second MISFETs are n-channel MISFETs, and said third MISFET is a p-channel MISFET.

11. A semiconductor integrated circuit device according to claim 10, further comprising:
a resistive element electrically connected between said first semiconductor region and said input pad.

12. A semiconductor integrated circuit device according to claim 11, wherein said resistive element is integrally formed with said first semiconductor region.

13. A semiconductor integrated circuit device according to claim 12, wherein said second and third MISFETs are elements of an internal circuit.

14. A semiconductor integrated circuit device according to claim 13, wherein said second and third gate electrodes each includes a two-layered structure consisting of a polycrystalline silicon layer and a silicide layer of a refractory metal on said polycrystalline silicon layer.

15. A semiconductor integrated circuit device according to claim 1, wherein said first semiconductor region consists of a single diffused drain structure.

16. A semiconductor integrated circuit device according to claim 15, wherein said first semiconductor region includes phosphorous impurity.

17. A semiconductor integrated circuit device according to claim 1, wherein said first MISFET utilizes a surface breakdown at a drain end thereof to protect said second MISFET, and said second doped subregion serves as a drain region of said second MISFET.

18. A semiconductor integrated circuit device according to claim 1, wherein the edge of the drain region of the first MISFET extends to a surface of the semiconductor substrate on which the first gate insulating film is provided; and extends to a surface of the semiconductor substrate on which the second gate insulating film is provided.

19. A semiconductor integrated circuit device, comprising:
an input pad on a semiconductor substrate;
a first MISFET which is an input protective element, said first MISFET having a first gate insulating film on said semiconductor substrate and a first gate electrode, with opposed edges, on said first gate insulating film, and further having source and drain regions and a first channel region in said semiconductor substrate, said drain region having a first semiconductor region, forming an edge of the drain region, in contact with said first channel region, said source region having a second semiconductor region in contact with said first channel region, said first gate electrode and said second semiconductor region being electrically connected to ground potential; and
a second MISFET which is a first stage inverter, said second MISFET having a second gate insulating film on said semiconductor substrate and a second gate electrode, with opposed edges, on said second gate insulating film, and further having source and drain regions and a second channel region in said semiconductor substrate, one of the source and drain regions including a first doped subregion of relatively high impurity concentration and a second doped subregion of relatively low impurity concentration, said first and second doped subregions including impurities of the same conductivity type as said first and second semiconductor regions, said second doped subregion being between said first doped subregion and the second channel region and in contact with the second channel region, said second doped subregion forming an edge of said one of the source and drain regions, said second gate electrode and said first semiconductor region being electrically connected to said input pad, said first gate insulating film having a same film thickness as said second gate insulating film, an impurity concentration of said first semiconductor region being larger than that of said second doped subregion, so that electrostatic destruction of the semiconductor integrated circuit device due to destruction of the first gate insulating film is reduced, as compared to electrostatic destruction of a corresponding semiconductor integrated circuit device where both the first and second MISFETs have the source and drain regions thereof with the first and second doped subregions.

20. A semiconductor integrated circuit device according to claim 19, wherein the first semiconductor region includes phosphorus impurities.

21. A semiconductor integrated circuit device according to claim 20, wherein the first doped subregion includes arsenic impurities.

22. A semiconductor integrated circuit device, comprising:
an input pad on a semiconductor substrate;
a first MISFET which is an input protective element, said first MISFET having a first gate insulating film on said semiconductor substrate and a first gate electrode, with opposed edges, on said first gate insulating film, and further having source and drain regions and a first channel region in said semiconductor substrate, said drain region having a first semiconductor region, forming an edge of said drain region, in contact with said first channel region, said source region having a second semiconductor region in contact with said first channel region, said first gate electrode and said second semiconductor region being electrically connected to ground potential;
a second MISFET to be protected by said input protective element, said second MISFET having a second gate insulating film on said semiconductor substrate and a second gate electrode on said second gate insulating film, said second gate electrode being electrically connected to said input pad; and
a third MISFET having a third gate insulating film on said semiconductor substrate and a third gate electrode, with opposed edges, on said third gate insulating film, and further having source and drain regions and a third channel region in said semiconductor substrate, one of the source and drain regions of the third MISFET including a first doped subregion of relatively high impurity concentration and a second doped subregion of relatively low impurity concentration, said first and second doped subregions including impurities of a same conductivity type as that of said first and second semiconductor regions, said second doped subregion being between said first doped subregion and said third channel region and in contact with the third channel region, said second doped subregion forming an edge of said one of the source and drain regions, an impurity concentration of said first semiconductor region being larger than that of said second doped subregion, said first gate insulating film having a same film thickness as that of said second gate insulating film and said third gate insulating film, said second and third MISFETs being included in an internal circuit of the semiconductor integrated circuit device.

23. A semiconductor integrated circuit device according to claim 22, wherein said second MISFET further has source and drain regions and a second channel region in said semiconductor substrate, one of the source and drain regions of the second MISFET including a third doped subregion of relatively high impurity concentration and a fourth doped subregion of relatively low impurity concentration, said fourth doped subregion being between said third doped subregion and second channel region, said third and fourth doped subregions including impurities of the same conductivity type as said first semiconductor region and having the same impurity concentration as said first and second doped subregions, respectively.

24. A semiconductor integrated circuit device according to claim 22, wherein said second MISFET is a first stage inverter in an input circuit, said first MISFET utilizing a surface breakdown at a drain end thereof to protect said second MISFET.

* * * * *